(12) United States Patent
Lim

(10) Patent No.: US 12,216,168 B2
(45) Date of Patent: Feb. 4, 2025

(54) DEVICE AND METHOD FOR DIAGNOSING BATTERY

(71) Applicant: LG ENERGY SOLUTION, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 148 days.

(21) Appl. No.: 18/011,396

(22) PCT Filed: Jul. 23, 2021

(86) PCT No.: PCT/KR2021/009543
§ 371 (c)(1),
(2) Date: Dec. 19, 2022

(87) PCT Pub. No.: WO2022/025533
PCT Pub. Date: Feb. 3, 2022

(65) Prior Publication Data
US 2023/0266393 A1   Aug. 24, 2023

(30) Foreign Application Priority Data
Jul. 31, 2020   (KR) .................. 10-2020-0096308

(51) Int. Cl.
*G01R 31/367* (2019.01)
*G01R 31/3835* (2019.01)
*G01R 31/392* (2019.01)

(52) U.S. Cl.
CPC ....... *G01R 31/367* (2019.01); *G01R 31/3835* (2019.01); *G01R 31/392* (2019.01)

(58) Field of Classification Search
CPC . G01R 31/367; G01R 31/392; G01R 31/3835
See application file for complete search history.

(56) References Cited

U.S. PATENT DOCUMENTS 5,808,447 A      9/1998  Hagino
6,477,024 B1 *  11/2002  Kikuchi ............ G01R 31/3842
                                                              324/432
(Continued)

FOREIGN PATENT DOCUMENTS

JP    2003-59544 A   2/2003
JP    3439013 B2     8/2003
(Continued)

OTHER PUBLICATIONS

International Search Report (PCT/ISA/210) issued in PCT/KR2021/009543 mailed on Nov. 9, 2021.
(Continued)

*Primary Examiner* — Minh Q Phan
(74) *Attorney, Agent, or Firm* — Birch, Stewart, Kolasch & Birch, LLP

(57) ABSTRACT

A battery diagnosis device includes a voltage measurement unit for measuring a voltage of a battery cell, a fitting value calculation unit for calculating a fitting voltage of the battery cell in a rest section after charging and discharging of the battery cell, and a diagnosis unit for diagnosing an abnormality of the battery cell by comparing the measured voltage measured by the voltage measurement unit and the fitting voltage calculated by the fitting value calculation unit, with respect to the rest section of the battery cell.

18 Claims, 8 Drawing Sheets

(56) References Cited

U.S. PATENT DOCUMENTS

| | | |
|---|---|---|
| 9,197,089 B2 | 11/2015 | Choe et al. |
| 2003/0006735 A1 | 1/2003 | Kawakami et al. |
| 2004/0251875 A1 | 12/2004 | Kinoshita et al. |
| 2019/0339333 A1 | 11/2019 | Gelso et al. |
| 2020/0191876 A1 | 6/2020 | Shin et al. |
| 2020/0350641 A1 | 11/2020 | Lee et al. |
| 2020/0355749 A1 | 11/2020 | Takahashi et al. |
| 2021/0208208 A1 | 7/2021 | Yazami |

FOREIGN PATENT DOCUMENTS

| | | |
|---|---|---|
| JP | 2005-3414 A | 1/2005 |
| JP | 2008-191103 A | 8/2008 |
| JP | 2008-256436 A | 10/2008 |
| JP | 4332321 B2 | 9/2009 |
| JP | 4377164 B2 | 12/2009 |
| JP | 2010-14636 A | 1/2010 |
| JP | 5089510 B2 | 12/2012 |
| JP | 2014-107156 A | 6/2014 |
| JP | 5620302 B2 | 11/2014 |
| JP | 6148879 B2 | 6/2017 |
| JP | 2017-132273 A | 8/2017 |
| JP | 2019-146302 A | 8/2019 |
| JP | WO2019/138286 A1 | 2/2021 |
| KR | 10-1402802 B1 | 6/2014 |
| KR | 10-2019-0136072 A | 12/2019 |
| KR | 10-2054050 B1 | 12/2019 |
| KR | 10-2020-0127459 A | 11/2020 |
| WO | WO 2019/229651 A1 | 12/2019 |

OTHER PUBLICATIONS

Extended European Search Report for European Application No. 21849369.0, dated Oct. 20, 2023.

* cited by examiner

DEVICE AND METHOD FOR DIAGNOSING BATTERY

CROSS-REFERENCE TO RELATED APPLICATIONS

This application claims the benefit of Korean Patent Application No. 10-2020-0096308, filed on Jul. 31, 2020 in the Korean Intellectual Property Office, the disclosure of which is incorporated herein in its entirety by reference.

TECHNICAL FIELD

The present invention relates to a battery diagnosis device and method for diagnosing whether a battery is abnormal by using a normal behavior simulation of a battery cell voltage.

BACKGROUND ART

Recently, research and development on secondary batteries has been actively carried out. Here, the secondary battery includes a battery capable of charging and discharging, and includes all of a conventional Ni/Cd battery, a Ni/MH battery, and a recent lithium ion battery. Among secondary batteries, lithium ion batteries have an advantage in that their energy density is much higher than that of conventional Ni/Cd batteries and Ni/MH batteries, and in addition, lithium ion batteries can be manufactured in small size and light weight, so they are used as power sources for mobile devices. In addition, the lithium ion battery has been attracting attention as a next-generation energy storage medium due to its extended use range as a power source for electric vehicles.

In addition, the secondary battery is generally used as a battery pack including a battery module in which a plurality of battery cells are connected in series and/or in parallel. Then, the state and operation of the battery pack are managed and controlled by the battery management system.

In general, in the case of an Energy Storage System (ESS), a list for performing a diagnosis is provided to prevent fire. The diagnostic list includes data on voltage, current, temperature, power, and the like, and the diagnostic items for each battery cell were mainly performed for overvoltage and undervoltage.

However, in reality, there are cases where defects occur other than the top or bottom of the battery cell voltage, and fires often occur even when overvoltage or undervoltage warnings do not appear. Therefore, a new diagnostic item is needed to prevent these problems.

DISCLOSURE OF THE INVENTION

Technical Problem

The present invention has been devised to solve the above problems, and an object of the present invention is to provide a device and method for diagnosing a battery to detect an abnormal behavior of a battery cell by simulating the shape of the voltage during rest after charging and discharging of the battery cell and comparing it with the actual measured voltage.

Technical Solution

A battery diagnosis device according to an embodiment of the present invention includes a voltage measurement unit configured to measure a voltage of a battery cell, a fitting value calculation unit configured to calculate a fitting voltage of the battery cell in a rest section after charging and discharging of the battery cell, and a diagnosis unit configured to diagnose an abnormality of the battery cell by comparing the measured voltage and the fitting voltage with respect to the rest section of the battery cell.

A battery diagnosis method according to an embodiment of the present invention includes measuring a voltage of a battery cell, calculating a fitting voltage of the battery cell in a rest section after charging and discharging of the battery cell, and diagnosing an abnormality of the battery cell by comparing the measured voltage of the battery cell with the fitting voltage of the battery cell with respect to the rest section of the battery cell.

Effects of the Invention

According to the battery diagnosis device and method of the present invention, the abnormal behavior of the battery cell can be detected by simulating the shape of the voltage during rest after charging and discharging of the battery cell and comparing it with the actual measured voltage.

MODE FOR CARRYING OUT THE INVENTION

Figure 1:
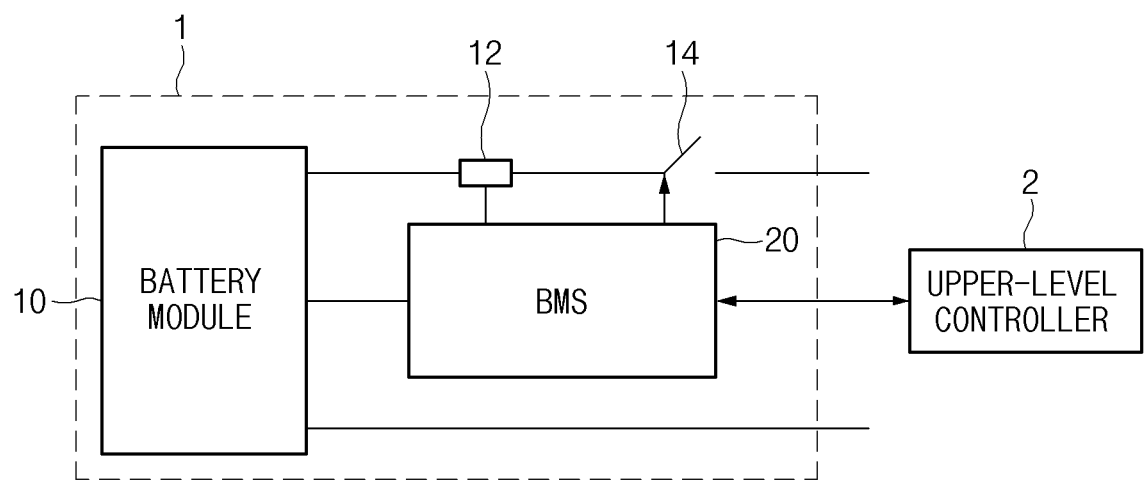
FIG. 1 is a block diagram showing the configuration of a general battery rack.

Hereinafter, various embodiments of the present invention will be described in detail with reference to the accompanying drawings. In this document, the same reference numerals are used for the same components in the drawings, and duplicate descriptions of the same components are omitted.

For the various embodiments of the present invention disclosed in this document, specific structural or functional descriptions have been exemplified for the purpose of describing the embodiments of the present invention only and various embodiments of the present invention may be implemented in various forms and should not be construed as being limited to the embodiments described in this document.

Expressions such as "first", "second", "first", or "second" used in various embodiments may modify various elements regardless of their order and/or importance, and do not limit the corresponding elements. For example, without departing from the scope of the present invention, a first component may be referred to as a second component, and similarly, a second component may be renamed and referred to as a first component.

Terms used in this document are only used to describe a specific embodiment, and may not be intended to limit the scope of other embodiments. The terms of a singular form may include plural forms unless otherwise specified.

All terms used herein, including technical or scientific terms, may have the same meaning as commonly understood by a person of ordinary skill in the art. Terms defined in a commonly used dictionary may be interpreted as having the same or similar meaning as the meaning in the context of the related technology, and are not interpreted as ideal or excessively formal meanings unless explicitly defined in this document. In some cases, even terms defined in this document cannot be interpreted to exclude embodiments of the present invention.

FIG. 1 is a block diagram showing the configuration of a general battery rack.

Referring to FIG. 1, it schematically shows a battery control system including a battery rack 1 and an upper-level controller 2 included in an upper-level system according to an embodiment of the present invention.

As shown in FIG. 1, the battery rack 1 includes a battery module 10 consisting of one or more battery cells and capable of charging and discharging, a switching unit 14 connected in series to the (+) terminal side or the (−) terminal side of the battery module 10 to control the charge/discharge current flow of the battery module 10, and a battery management system 20 (e.g., MBMS) for controlling and managing the voltage, current, temperature, and the like of the battery rack 1 to prevent overcharging and overdischarging.

Here, the switching unit 14 is a semiconductor switching element for controlling the current flow for charging or discharging of a plurality of the battery modules 10, and for example, at least one MOSFET, or a relay, a magnetic contactor, and the like may be used according to the specifications of the battery rack 1.

In addition, in order to monitor the voltage, current, temperature, etc. of the battery rack 1, the battery management system 20 may measure or calculate a voltage and a current of a gate, a source, and a drain of a semiconductor switching device. In addition, the battery management system 20 may measure the current, voltage, temperature, etc. of the battery rack 1 using the sensor 12 provided adjacent to the semiconductor switching element. Here, the sensor 12 may correspond to a voltage measurement unit to be described later.

The battery management system 20 is an interface for receiving values obtained by measuring the above-described various parameters, and may include a plurality of terminals and a circuit connected to these terminals to process input values. Also, the battery management system 20 may control ON/OFF of the switching unit 14, and for example, a MOSFET, and may be connected to the battery module 10 to monitor the state of each battery module 10.

Meanwhile, in the battery management system 20 of the present invention, the voltage in the rest section after charging and discharging of the battery cells may be calculated through a separate program as described below. In addition, by comparing the calculated voltage with the voltage detected by the sensor 12, it is possible to diagnose whether the battery cell is abnormal.

The upper-level controller 2 may transmit a control signal for the battery module 10 to the battery management system 20. Accordingly, the operation of the battery management system 20 may be controlled based on a signal applied from the upper-level controller. On the other hand, the battery cell of the present invention may be a configuration included in the battery module 10 used in the Energy Storage System (ESS). And in this case, the upper-level controller 2 may be an ESS controller. However, the battery rack 1 is not limited to this use.

Since the configuration of the battery rack 1 and the configuration of the battery management system 20 are known configurations, a more detailed description thereof will be omitted.

Figure 2:
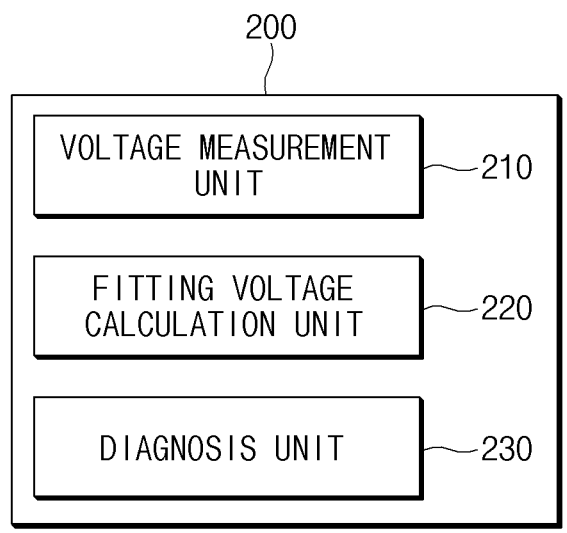
FIG. 2 is a block diagram showing the configuration of a battery diagnosis device according to an embodiment of the present invention.

FIG. 2 is a block diagram showing the configuration of a battery diagnosis device according to an embodiment of the present invention.

Referring to FIG. 2, a battery diagnosis device 200 according to an embodiment of the present invention may include a voltage measurement unit 210, a fitting voltage calculation unit 220, and a diagnosis unit 230.

The voltage measurement unit 210 may measure the voltage of each battery cell. In this case, the voltage measurement unit 210 may measure the voltage at a set time interval. Also, the voltage measurement unit 210 may measure the current flowing through the battery cell. Accordingly, it may be determined whether the battery cell is in a rest section (i.e., a section in which current is 0) after charging or discharging through the current value of the battery cell measured by the voltage measurement unit 210.

The fitting voltage calculation unit 220 may calculate the fitting voltage of the battery cell in the rest section after charging and discharging of the battery cell. Specifically, the fitting voltage calculation unit 220 calculates the fitting voltage of the battery cell by exponential fitting the voltage of the battery cell in a preset first section with respect to the rest section after charging and discharging of the battery cell. For example, the first section may be a section with IR Drop.

In addition, the fitting voltage calculation unit 220 may calculate the fitting voltage of the battery cell by linearly fitting the voltage of the battery cell in the second section after the first section. For example, the second section may be a stabilization section in which the voltage is maintained or linearly derated during rest of the battery cell.

The fitting voltage calculation unit 220 may preset the coefficient of the exponential part of the fitting voltage calculation equation for the rest section after charging and discharging of the battery cell to be greater than or less than 0. For example, the calculation equation in the above-described first section of the fitting voltage can be expressed as $V1=a*\exp(b*X)+c$, and in this case, the value a, which is the coefficient of the exponent part, may be set to be greater than 0. Therefore, the shape of the fitting voltage of the battery cell can be more clearly displayed.

In addition, the fitting voltage calculation unit 220 may calculate the fitting voltage of the battery cell by reflecting the power consumed by the battery management system (Module Battery Management System (MBMS)) of the battery module. In this case, the fitting voltage calculation unit 220 may calculate the fitting voltage of the battery cell by linearly derating the voltage of the battery cell with a slope corresponding to the power consumed by the battery management system of the battery module in the second section described above. For example, power consumption of the battery management system may be converted using an Open Circuit Voltage (OCV) table that defines a relationship between battery capacity and voltage.

As such, in relation to the fitting voltage calculation unit 220, in the rest section after charging and discharging the battery cell, by calculating the fitting voltage by dividing the section in which the voltage shape of the battery cell appears in exponential form and the section in which the voltage shape appears linearly, compared to the case of fitting in one way as in the prior art, abnormal voltage behavior of battery cells can be detected more accurately.

Meanwhile, the fitting voltage calculation unit 220 may adjust the number of voltage data (i.e., voltage) measured by the voltage measurement unit 210 based on the sampling time of the measured voltage data of the battery cell. For example, the number of voltage data is adjusted such as if the sampling time of voltage data is 1 minute, it is 30 pieces, and if 2 minutes, it is 15 pieces, and if 1 second, it is 1800 pieces, etc., and the exponential fitting time Tau can be set accordingly.

In addition, the fitting voltage calculation unit 220 may separate the measured voltage data when the measurement interval of the voltage data of the battery cell measured by the voltage measurement unit 210 is greater than or equal to a preset time. For example, the fitting voltage calculation unit 220 may calculate the fitting voltage by separating the corresponding data when the log phase time interval of the voltage data is 1 hour or more. That is, when the log interval of the voltage data is 1 hour or more, the fitting voltage can be calculated for each section by dividing it into a plurality of sections based on the corresponding part.

Regarding the rest section after charging and discharging the battery cell, the diagnosis unit 230 may diagnose the abnormality of the battery cell by comparing the measured voltage measured by the voltage measurement unit 210 with the fitting voltage calculated by the fitting voltage calculation unit 220. Specifically, the diagnosis unit 230 may determine that an abnormality has occurred in the battery cell when the difference value between the measured voltage and the fitting voltage in the rest section of the battery cell is equal to or greater than a preset first reference value. At this time, by comparing the maximum value of the difference value between the measured voltage and the fitting voltage with the first reference value, it is possible to determine whether the battery cell is abnormal.

In addition, when the standard deviation of the difference value between the measured voltage measured by the voltage measurement unit 210 and the fitting voltage calculated by the fitting voltage calculation unit 220 is equal to or greater than a preset second reference value with respect to the rest section after charging and discharging battery cells, the diagnosis unit 230 may determine that an abnormality has occurred in the battery cell. In this case, the standard deviation may represent an error for each battery cell at a specific moment. For example, it is possible to determine whether the battery cell is abnormal by comparing the standard deviation of the maximum value among the difference values between the measured voltage and the fitting voltage with the second reference value.

With respect to the rest section after charging and discharging battery cells, the diagnosis unit 230 may determine that an abnormality has occurred in a battery cell in which the difference value between the measured voltage measured by the voltage measurement unit 210 and the fitting voltage calculated by the fitting voltage calculation unit 220 is greater than or equal to a preset first reference value twice or more. Also, as described above, the diagnosis unit 230 may determine that an abnormality has occurred in battery cells in which the standard deviation of the difference value between the measured voltage and the fitting voltage is greater than the second reference value twice or more.

Meanwhile, although not shown in FIG. 2, the battery diagnosis device 200 according to an embodiment of the present invention may include a storage unit. The storage unit may store voltage and current measurement data of battery cells, calculated fitting voltage data, power consumption data of the battery management system, and the like. However, the storage unit does not necessarily have to be included in the battery diagnosis device 200, and the storage unit may be included in an external server to transmit and receive data through a separate communication module (not shown).

In addition, the battery diagnosis device 200 according to an embodiment of the present invention may further include a display unit (not shown). Therefore, the battery diagnosis device 200 according to an embodiment of the present invention may express the voltage or current shape measured by the voltage measurement unit 210 or the shape of the fitting voltage calculated through the fitting voltage calculation unit 220 in a graph form to the user through the display unit. In addition, the display unit may be provided with a user interface (e.g., a touch pad, etc.) to receive a user's input.

As such, according to the battery diagnosis device according to an embodiment of the present invention, the abnormal behavior of the battery cell can be detected by simulating the shape of the voltage during rest after charging and discharging of the battery cell and comparing it with the actual measured voltage.

Figure 3:
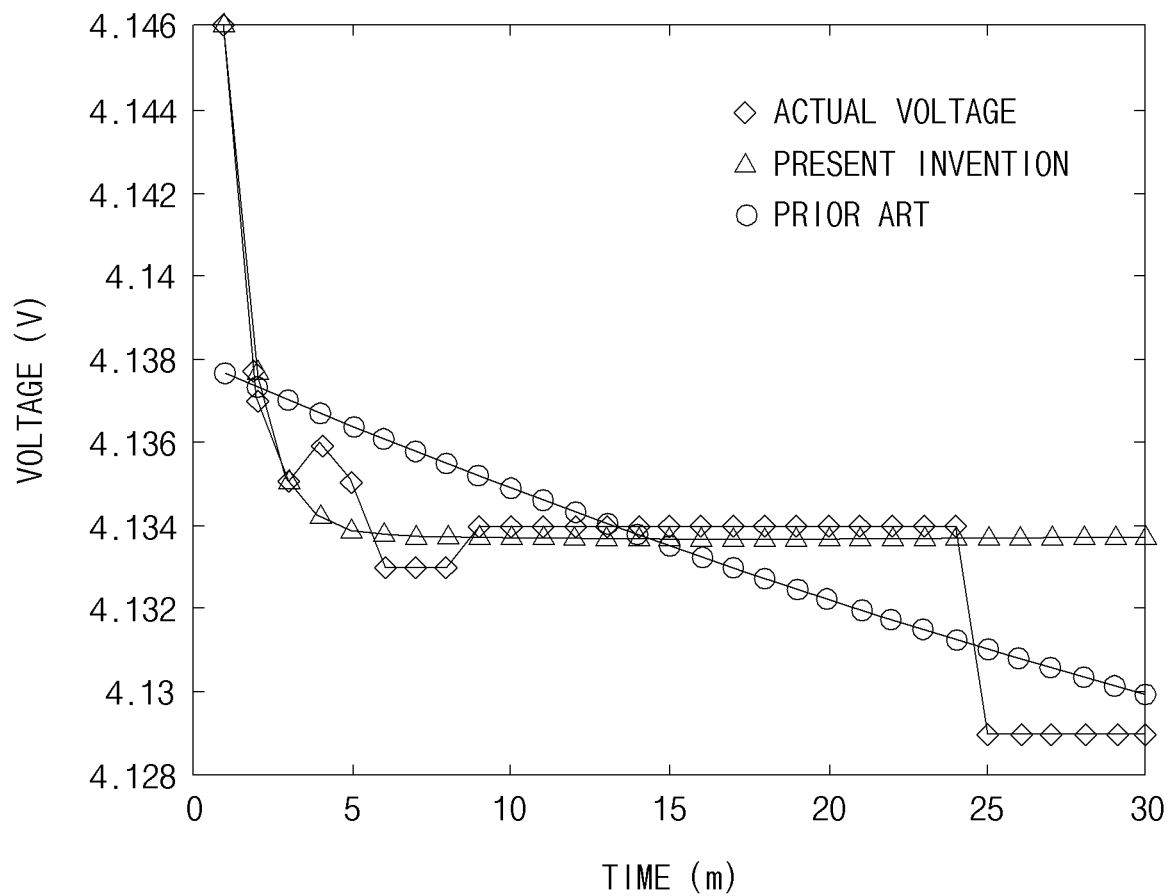
FIG. 3 is a view showing an actual voltage shape, a voltage shape of a battery cell calculated by the battery diagnosis device according to an embodiment of the present invention, and a voltage shape calculated according to the prior art.

FIG. 3 is a view showing an actual voltage shape, a voltage shape of a battery cell calculated by the battery diagnosis device according to an embodiment of the present invention, and a voltage shape calculated according to the prior art. Referring to FIG. 3, the x-axis represents time (minutes), and the y-axis represents voltage (V). At this time, the graph of FIG. 3 shows the voltage shape fitted in exponential form with the logged voltage data after excluding the trinkle charge (i.e., the form of operating the charge in a spot-like manner to match the SOC 100) in the rest section after charging.

As shown in FIG. 3, it can be seen that the actual voltage in the rest section after charging the battery cell initially decreases in a similar form to an exponential function, and appears almost constant between about 8 minutes to 25 minutes, and then appears in a shape that decreases linearly again.

In this regard, it can be seen that when the voltage is simply linearly fitted as in the conventional method, an error with the actual voltage is large. Therefore, in relation to the battery diagnosis device according to an embodiment of the present invention, in the rest voltage after charging or discharging, by fitting the voltage in the form of an exponential in the section where the voltage rapidly decreases, and by fitting it linearly in the section where the polarization is resolved, it is possible to calculate the voltage of the rest section more accurately than in the prior art. At this time, the coefficient of the exponential part in the voltage fitting equation is set to be greater than 0, and the exponential fitting time can be freely adjusted according to the sampling time.

In addition, with respect to the linear section of FIG. 3 as described above, considering the power consumption of the module battery management system (MBMS), even if charging or discharging of the battery does not occur, it can be expressed in the form of linearly decreasing by reflecting a decrease in voltage due to power supplied to the battery management system.

Figure 4:
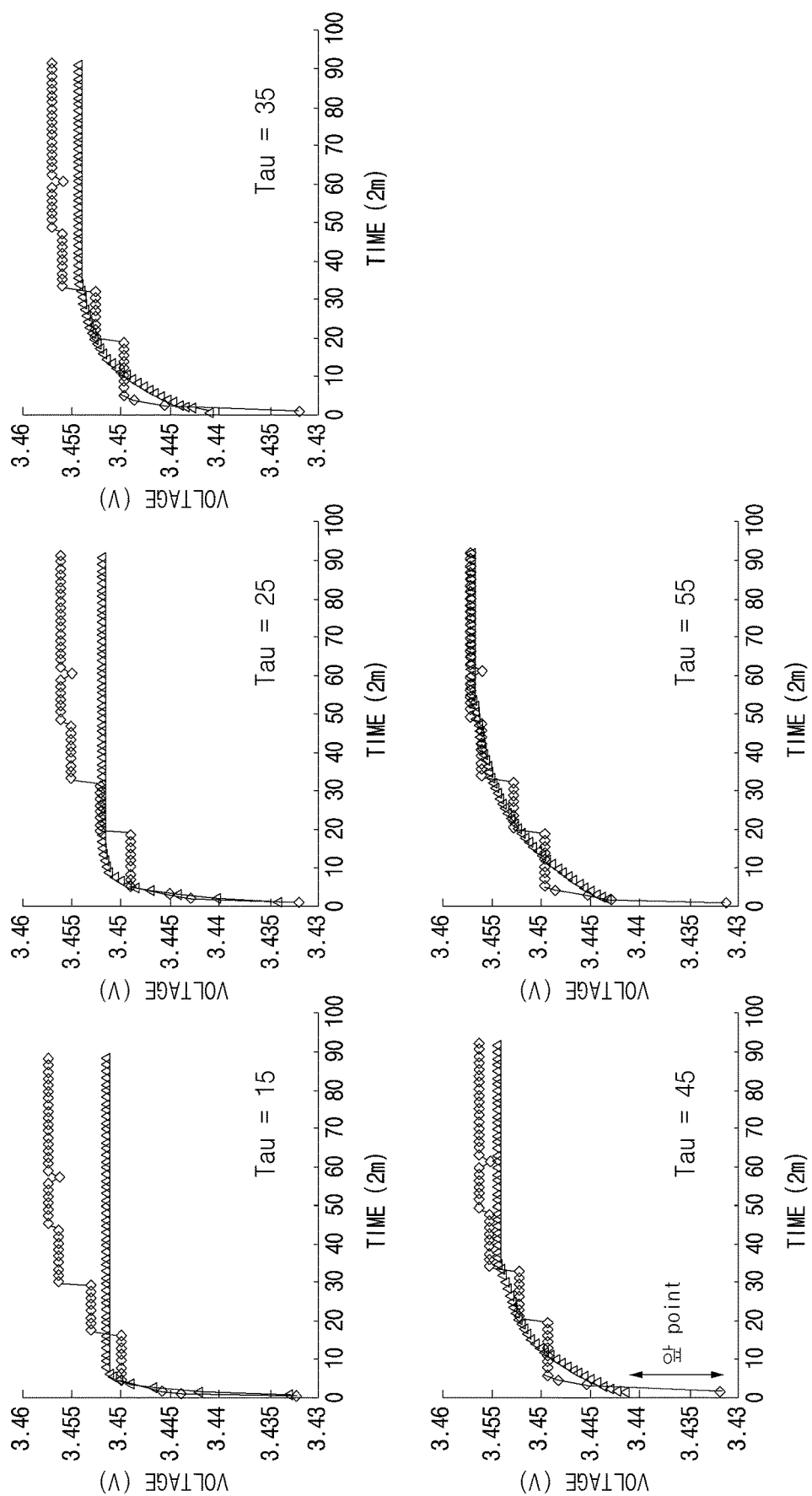
FIG. 4 is a diagram illustrating a change in a voltage shape according to a fitting time in a battery diagnosis device according to an embodiment of the present invention.

FIG. 4 is a diagram illustrating a change in a voltage shape according to a fitting time in a battery diagnosis device according to an embodiment of the present invention.

Referring to FIG. 4, voltages in the rest section after discharging when Tau values corresponding to exponential fitting times of voltages are set to 15, 25, 35, 45 and 55, respectively. FIG. 4 shows a comparison of the actually measured voltage data and the fitting voltage data after excluding the trinkle charge part in the rest section after discharging. In each graph of FIG. 4, the x-axis represents time (2 minutes), and the y-axis represents voltage (V).

As shown in FIG. 4, it can be seen that as the Tau value decreases (e.g., Tau=15), the actual voltage and the fitting voltage tend to match at the front end of the graph, and conversely, as the value of Tau increases (e.g., Tau=55), the actual voltage and the fitting voltage tend to match at the rear end of the graph.

As such, since the section where the actual voltage and the fitting voltage match appears differently depending on the Tau value, in the battery diagnosis device according to an embodiment of the present invention, the Tau value can be appropriately set by considering the relaxation time without fixing the exponential fitting time as a constant value. For example, in the battery diagnosis device according to an embodiment of the present invention, the Tau value is set to 15 in the rest section after charging, considering that the rest section after discharging is longer than the rest section after charging and the tendency of the voltage to rise at the rear end, etc. it is possible to set the Tau value to 30, which is greater than the rest section after charging. However, the Tau value in the battery diagnosis device of the present invention is not limited thereto and may be set to an appropriate value in some cases.

Figure 5:
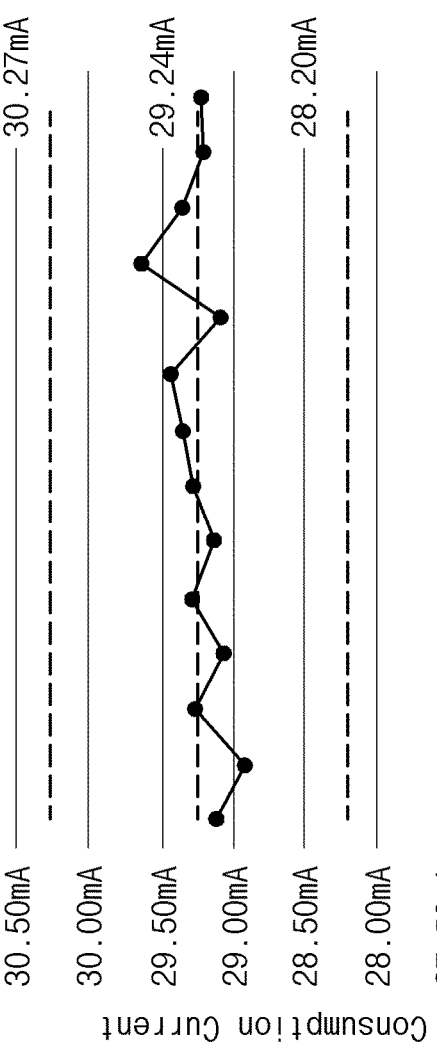
FIG. 5 is a diagram illustrating current consumption of a battery management system (MBMS) of a battery module according to an embodiment of the present invention.
Figure 5:
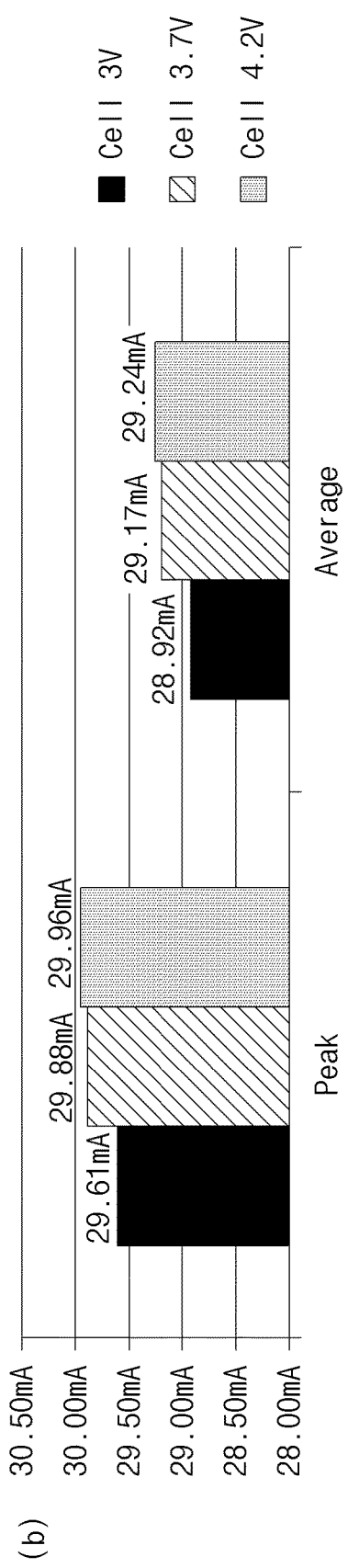

FIG. 5 is a diagram illustrating current consumption of a battery management system (MBMS) of a battery module according to an embodiment of the present invention.

After charging or discharging a battery cell, the voltage may drop even in a state where no current flows in the rest section. This is mainly a voltage drop due to the current consumption of the battery management system.

Accordingly, in the battery diagnosis device according to an embodiment of the present invention, the fitting voltage in the rest section after charging and discharging of the battery cell may be calculated in consideration of the influence of current consumption by the battery management system (e.g., MBMS). In order to reflect the influence of the current consumption of the battery management system, for example, the current consumption value measured at the ESS development center may be used.

In this regard, referring to (a) of FIG. 5 shows that the average current consumption is measured for a plurality of module battery management systems. In (a) of FIG. 5, the x-axis represents samples #1 to #14, and the y-axis represents the current consumption (mA) of each sample. As shown in (a) of FIG. 5, there are some differences for each sample of each battery management system, but the current consumption of the battery management system is both within the range of 28.20 mA and 30.27 mA, and the average current consumption is 29.24 mA, indicating that the deviation is not large.

In addition, referring to (b) of FIG. 5, peak values and average values for current consumption of the battery management system are shown when the voltages of the battery cells are 3 V, 3.7 V, and 4.2 V, respectively. As shown in (b) of FIG. 5, as the voltage of the battery cell increases, the current consumption of the battery management system also increases, but it can be seen that the difference is relatively small, with a maximum of 0.3 mA.

As such, since the current consumption of the battery management system does not have a relatively large variation and appears almost constant even when the voltage of the battery cell changes, in the battery diagnosis device according to an embodiment of the present invention, the fitting voltage may be calculated by setting the consumption current of the battery management system to a constant value (e.g., the upper limit of 30.27 mA). For example, a value corresponding to the consumption current of the battery management system may be used as a slope, and the voltage of the rest section may be linearly derated after charging and discharging of the battery cell.

Figure 6:
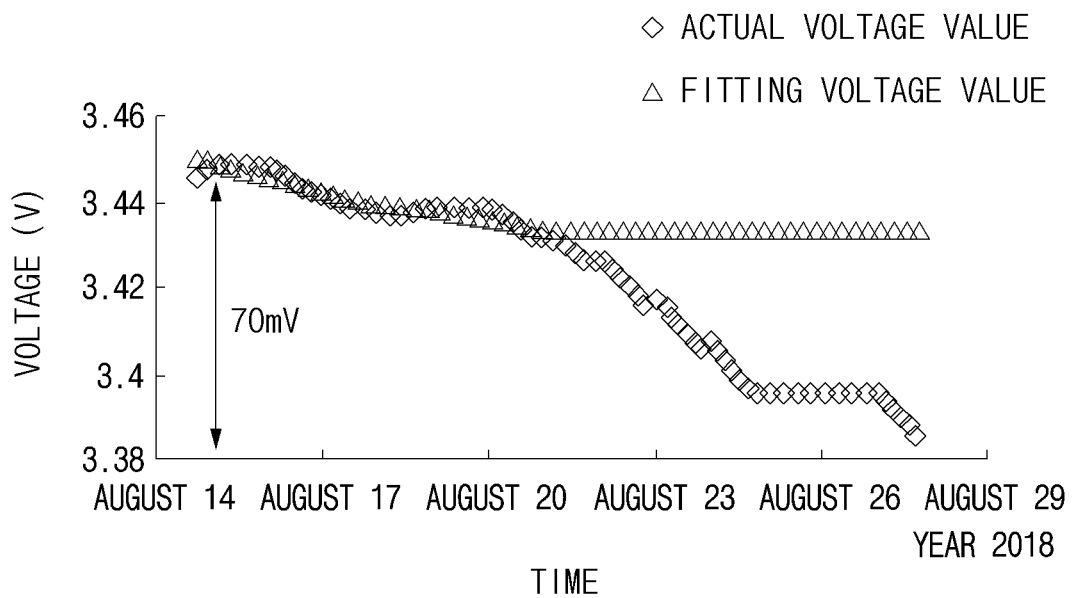
FIG. 6 is a diagram comparing a voltage shape calculated through a battery diagnosis device according to an embodiment of the present invention and an actual voltage value.
Figure 6:
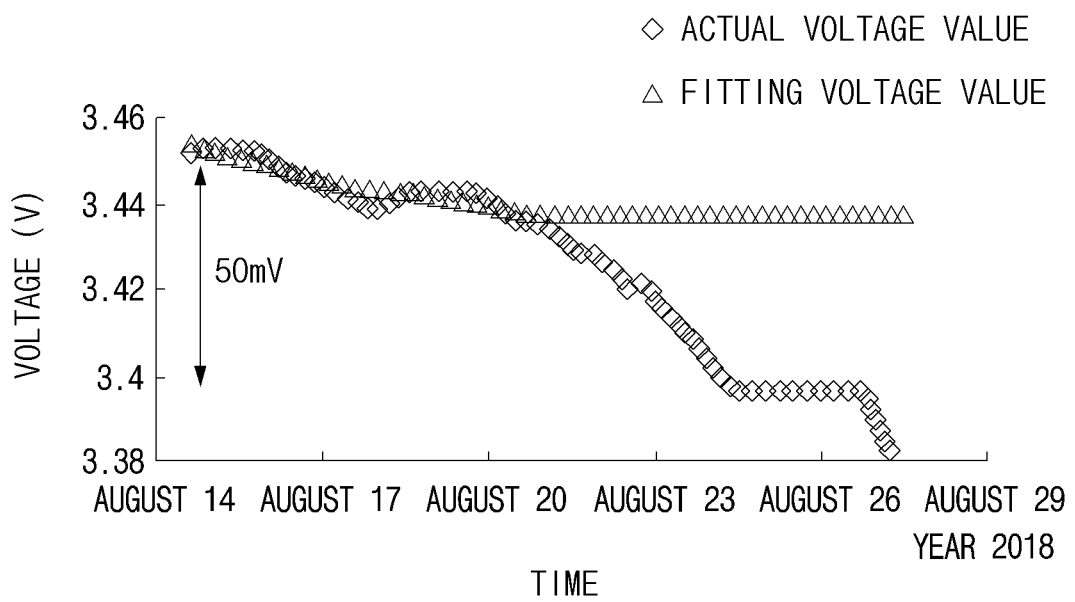

FIG. 6 is a diagram comparing a voltage shape calculated through a battery diagnosis device according to an embodiment of the present invention and an actual voltage value. The x-axis of FIG. 6 represents time, and the y-axis represents the voltage of a specific battery cell included in a non-operating battery rack.

Referring to FIG. 6, in a case where a plurality of battery racks in a bank of batteries are operating while some of them are not operating, it shows that the actual voltage of the battery cells in the non-operating battery rack dropped approximately 70 mV and 50 mV over 15 days, respectively.

As such, even if the battery rack is not operated, the actual voltage may tend to drop more compared to the fitting voltage after a long time. However, the difference value due to the lowered voltage is about 50 mV to about 70 mV, and the maximum error is only 0.049, and in the systematic analysis, considering the amount of voltage decrease due to the current consumption of the battery management system, it can be considered that it is in the normal range.

Figure 7:
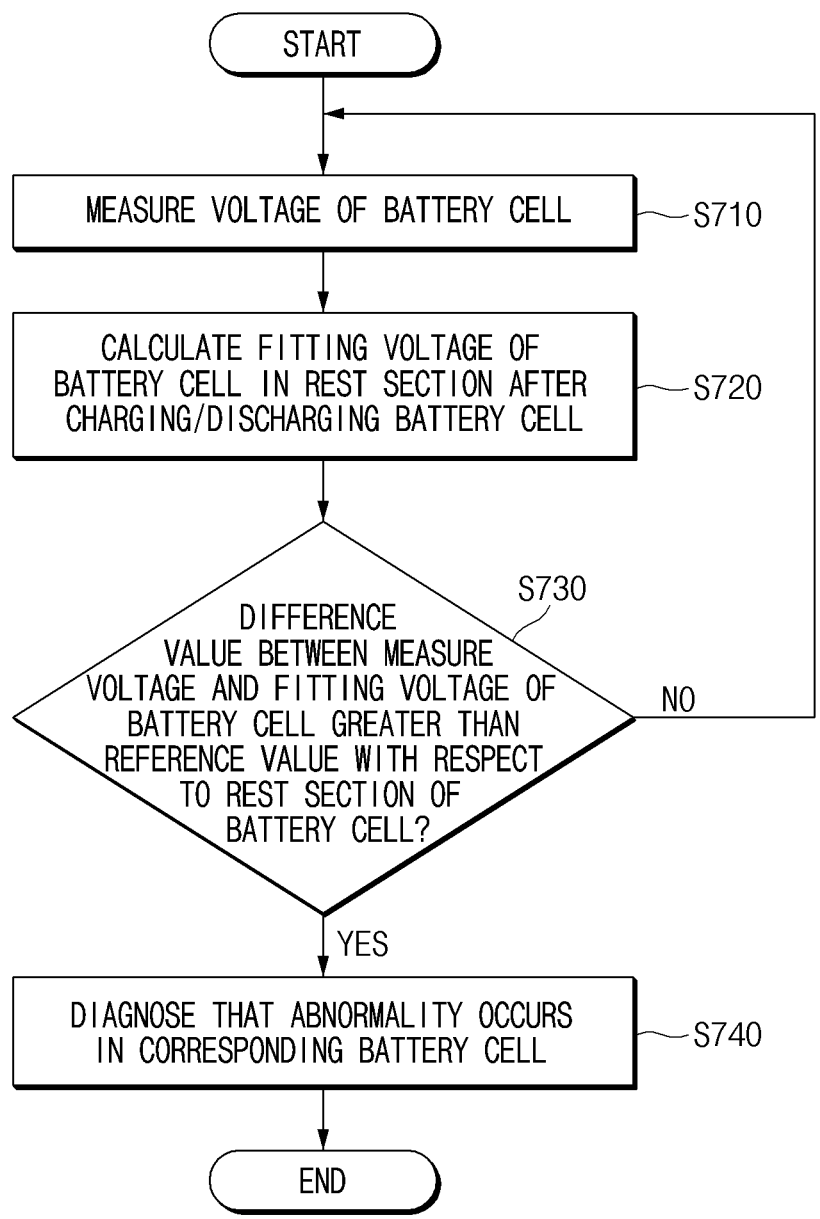
FIG. 7 is a flowchart illustrating a method for diagnosing a battery according to an embodiment of the present invention.

FIG. 7 is a flowchart illustrating a method for diagnosing a battery according to an embodiment of the present invention.

Referring to FIG. 7, in the battery diagnosis method according to an embodiment of the present invention, the voltage of a battery cell is first measured (S710). In this case, in operation S710, the voltage may be measured at regular time intervals. In addition, although not shown in FIG. 6, in operation S710, it is possible to determine whether the battery cell is a rest section after charging or discharging, that is, a section in which the current is 0 by measuring the current flowing through the battery cell.

Then, after charging and discharging the battery cell, the fitting voltage of the battery cell in the rest section is calculated (S720). Specifically, in operation S720, with respect to the rest section after charging and discharging of the battery cell, the fitting voltage of the battery cell may be calculated by exponentially fitting the voltage of the battery cell in the preset first section (e.g., IR Drop section). In addition, in the second section after the first section (e.g., voltage maintenance or linear derating section), by linearly fitting the voltage of the battery cell, the fitting voltage of the battery cell can be calculated.

In particular, in operation S720, the fitting voltage of the battery cell may be calculated by reflecting the power consumed by the battery management system (MBMS) of the battery module. In this case, the fitting voltage of the battery cell may be calculated by linearly derating the voltage of the battery cell with a slope corresponding to the power consumed by the battery management system of the battery module in the second section described above.

Then, it is determined whether a difference value between the voltage measured for the rest section of the battery cell and the fitting voltage of the battery cell is equal to or greater than a reference value (a first reference value) (S730). If the difference value is less than the reference value (NO), the process returns to operation S710 again.

Meanwhile, when the difference value between the measured voltage and the fitting voltage of the battery cell is equal to or greater than the reference value (YES), it may be diagnosed that an abnormality has occurred in the corresponding battery cell (S740). In this case, it is possible to determine whether the battery cell is abnormal by comparing the maximum value of the difference value between the measured voltage and the fitting voltage with the above-described reference value.

In addition, although not shown in FIG. 6, with respect to the rest section after charging and discharging of the battery cell, when the standard deviation of the difference value between the measured voltage of the battery cell and the calculated fitting voltage is equal to or greater than a preset reference value (the second reference value), it may be determined that an abnormality has occurred in the battery cell. For example, it is possible to determine whether the battery cell is abnormal by comparing the standard deviation of the maximum value among the difference values between the measured voltage and the fitting voltage with the above-mentioned reference value.

As such, according to the battery diagnosis method according to an embodiment of the present invention, the abnormal behavior of the battery cell can be detected by simulating the shape of the voltage during rest after charging and discharging of the battery cell and comparing it with the actual measured voltage.

Figure 8:
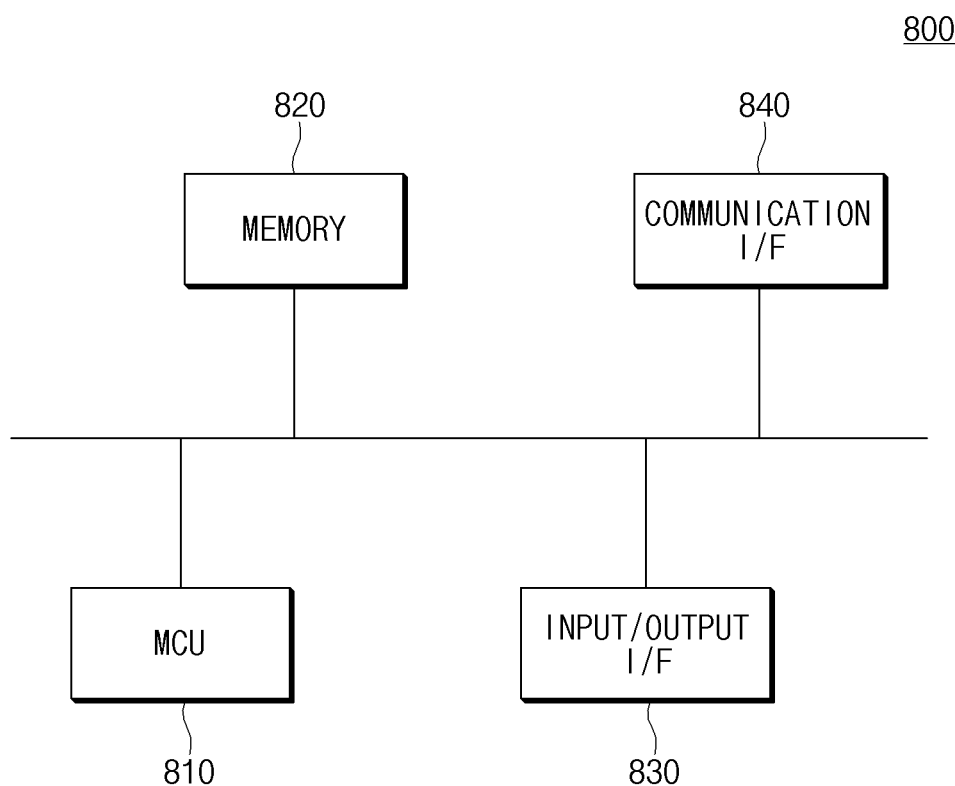
FIG. 8 is a block diagram illustrating a hardware configuration of a battery diagnosis device according to an embodiment of the present invention.

FIG. 8 is a block diagram illustrating a hardware configuration of a battery diagnosis device according to an embodiment of the present invention.

Referring to FIG. 8, the battery diagnosis device 800 according to an embodiment of the present invention may include an MCU 810, a memory 820, an input/output I/F 830, and a communication I/F 840.

The MCU 810 may be a processor that executes various programs (e.g., battery diagnostic program, fitting voltage calculation program, etc.) stored in the memory 820, processes various data for calculating the rest voltage of the battery cell through these programs, and performs the functions of FIG. 2 described above.

The memory 820 may store various programs related to calculating a fitting voltage of a battery cell, diagnosing an abnormality, and the like. In addition, the memory 820 may store various data such as measured voltage and current data of a battery cell and current consumption of a battery management system.

A plurality of such memories 820 may be provided as needed. The memory 820 may be a volatile memory or a non-volatile memory. The memory 820 as a volatile memory may include RAM, DRAM, SRAM, or the like. The memory 820 as a non-volatile memory may be a ROM, PROM, EAROM, EPROM, EEPROM, flash memory, or the like. Examples of the above-listed memories 820 are merely examples and are not limited to these examples.

The input/output I/F 830 may provide an interface that connects between an input device (not shown) such as a keyboard, mouse, and touch panel and an output device such as a display (not shown) and the MCU 810 to transmit and receive data.

The communication I/F 840 is a configuration capable of transmitting and receiving various data with a server, and may be various devices capable of supporting wired or wireless communication. For example, a program for diagnosing and calculating the fitting voltage of a battery cell may be transmitted to/received from an external server provided separately through the communication I/F 840.

In this way, the computer program according to an embodiment of the present invention is recorded in the memory 820 and processed by the MCU 810, so that, for example, it may be implemented as a module that performs each functional block illustrated in FIG. 2.

In the above, even if all the components constituting the embodiments of the present invention are described as being combined into one or operating in combination, the present invention is not necessarily limited to these embodiments. That is, within the scope of the object of the present invention, all of the constituent elements may be selectively combined and operated in one or more.

In addition, terms such as "include", "consist of" or "have" described above mean that the corresponding constituent components can be present unless otherwise stated, and it should be construed that other components may be further included rather than excluding other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and unless explicitly defined in the present invention, they are not interpreted in an ideal or excessively formal sense.

The above description is merely illustrative of the technical idea of the present invention, and those of ordinary skill in the art to which the present invention pertains will be able to make various modifications and variations without departing from the essential characteristics of the present invention. Therefore, the embodiments disclosed in the present invention are not intended to limit the technical idea of the present invention, but to explain, and the scope of the technical idea of the present invention is not limited by these embodiments. The scope of protection of the present invention should be interpreted by the claims below, and all technical ideas within the scope equivalent thereto should be construed as being included in the scope of the present invention.

The invention claimed is:

1. A battery diagnosis device comprising:
    a voltage measurement unit configured to measure a voltage of a battery cell;
    a fitting value calculation unit configured to calculate a fitting voltage of the battery cell in a rest section after charging and discharging of the battery cell; and
    a diagnosis unit configured to diagnose an abnormality of the battery cell by comparing the measured voltage and the fitting voltage with respect to the rest section of the battery cell,
    wherein the diagnosis unit is configured to output a result including whether the abnormality of the battery cell has been diagnosed, and
    wherein the battery cell is managed based on the result output by the diagnosis unit.

2. The battery diagnosis device of claim 1, wherein the fitting value calculation unit calculates the fitting voltage of the battery cell by exponential fitting the voltage of the battery cell in a preset first section, with respect to the rest section after charging and discharging of the battery cell, and calculates the fitting voltage of the battery cell by linearly fitting the voltage of the battery cell in a second section after the first section.

3. The battery diagnosis device of claim 2, wherein the fitting value calculation unit sets a coefficient of an exponential part of the fitting voltage to be greater than 0.

4. The battery diagnosis device of claim 1, wherein the fitting value calculation unit reflects power consumed by a Module Battery Management System (MBMS) of a battery module to calculate the fitting voltage of the battery cell.

5. The battery diagnosis device of claim 4, wherein the fitting value calculation unit calculates the fitting voltage of the battery cell by linearly derating a voltage of the battery cell with a slope corresponding to power consumed by the MBMS.

6. The battery diagnosis device of claim 1, wherein the fitting value calculation unit adjusts a number of measured voltage data based on a sampling time of the measured voltage data of the battery cell.

7. The battery diagnosis device of claim 1, wherein the fitting value calculation unit separates measured voltage data when a measurement interval of the measured voltage data of the battery cell is more than a preset time.

8. The battery diagnosis device of claim 1, wherein when a difference value between the measured voltage and the fitting voltage is equal to or greater than a preset first reference value with respect to the rest section of the battery cell, the diagnosis unit determines that the abnormality has occurred in the battery cell.

9. The battery diagnosis device of claim 8, wherein when a standard deviation of the difference value between the measured voltage and the fitting voltage is equal to or greater than a preset second reference value with respect to the rest section of the battery cell, the diagnosis unit determines that the abnormality has occurred in the battery cell.

10. The battery diagnosis device of claim 8, wherein the diagnosis unit determines that the abnormality has occurred in the battery cell when the difference value between the measured voltage and the fitting voltage is equal to or greater than the preset first reference value occurs twice or more with respect to the rest section of the battery cell.

11. The battery rack battery diagnosis device of claim 8, wherein the difference value is based on a maximum difference value between the measured voltage and the fitting voltage.

12. A battery diagnosis method comprising:
measuring a voltage of a battery cell;
calculating a fitting voltage of the battery cell in a rest section after charging and discharging of the battery cell;
diagnosing an abnormality of the battery cell by comparing the measured voltage of the battery cell with the fitting voltage of the battery cell with respect to the rest section of the battery cell; and
managing the battery cell based on the diagnosing of the abnormality of the battery cell.

13. The method of claim 12, wherein the calculating of the fitting voltage of the battery cell comprises exponential fitting the voltage of the battery cell in a preset first section, with respect to the rest section after charging and discharging of the battery cell, and linearly fitting the voltage of the battery cell in a second section after the first section.

14. The method of claim 12, wherein the calculating of the fitting voltage of the battery cell comprises reflecting power consumed by a module battery management system (BMS) (MBMS) of the battery cell to calculate the fitting voltage of the battery cell.

15. The method of claim 14, wherein the calculating of the fitting voltage of the battery cell comprises linearly derating a voltage of the battery cell with a slope corresponding to power consumed by the MBMS of the battery module.

16. The method of claim 12, wherein the diagnosing of the abnormality of the battery cell comprises determining that the abnormality has occurred in the battery cell when a difference value between the measured voltage and the fitting voltage of the battery cell is equal to or greater than a preset first reference value with respect to the rest section of the battery cell.

17. The method of claim 16, wherein the difference value is based on a maximum difference value between the measured voltage and the fitting voltage.

18. A battery rack comprising:
the battery diagnosis device of claim 1; and
a module battery management system (MBMS),
wherein the battery cell is managed by the MBMS based on whether the diagnosis unit diagnoses the abnormality in the battery cell.

* * * * *